United States Patent [19]
Brady et al.

[11] Patent Number: 5,527,724
[45] Date of Patent: Jun. 18, 1996

[54] METHOD TO PREVENT LATCH-UP AND IMPROVE BREAKDOWN VOLATGE IN SOI MOSFETS

[75] Inventors: Frederick T. Brady, Chantilly; Nadim F. Haddad, Oakton; Arthur Edenfeld, Middlebrook, all of Va.

[73] Assignee: Loral Federal Systems Company, McLean, Va.

[21] Appl. No.: 304,639

[22] Filed: Sep. 12, 1994

Related U.S. Application Data

[63] Continuation of Ser. No. 56,042, Apr. 30, 1993, abandoned.

[51] Int. Cl.$^6$ .................................................. H01L 21/86
[52] U.S. Cl. ...................... 437/24; 437/21; 148/DIG. 40
[58] Field of Search ................................ 437/21, 24, 46, 437/62, 955, 959; 148/DIG. 13, DIG. 40, DIG. 59, DIG. 77

[56] References Cited

U.S. PATENT DOCUMENTS

| | | | |
|---|---|---|---|
| 4,160,984 | 7/1979 | Ladd, Jr. et al. | 437/24 |
| 4,559,547 | 12/1985 | Shiraki et al. | 257/392 |
| 4,603,471 | 8/1986 | Strain | 437/24 |
| 4,634,473 | 1/1987 | Swartz et al. | 437/24 |
| 4,689,662 | 8/1987 | Aronowitz | 437/25 |
| 4,766,482 | 8/1988 | Smeltzer et al. | 437/21 |
| 4,946,735 | 8/1990 | Lee et al. | 148/DIG. 58 |
| 5,053,353 | 10/1991 | Black | 437/62 |
| 5,102,810 | 4/1992 | Salih | 437/131 |
| 5,134,447 | 7/1992 | Ng et al. | 257/606 |
| 5,156,994 | 10/1992 | Moslehi | 437/21 |

OTHER PUBLICATIONS

Wolf, Stanley, "Silicon Processing for the VLSI ERA; vol. 2 Process Integration", pp. 66–72, 1990.
Ghandhi, S. K., "VLSI Fabrication Principles," pp. 337–340, pp. 353–354, 1983.

*Primary Examiner*—Chandra Chaudhari

[57] ABSTRACT

SOI (silicon-on-insulator) technology has been touted as a promising approach for fabricating advanced integrated circuits because of its advantage over bulk silicon circuits such as faster speed and improved radiation tolerance. One drawback to SOI is that parasitic bipolar induced latch-up/breakdown voltage levels severely limits the maximum supply voltage at which SOI circuits and devices can operate. When the parasitic device turns on, the SOI transistor cannot be switched off by changing the gate bias. What is described is a method whereby the operating voltage in which this effect occurs is significantly increased thus allowing circuit operation at reasonable power supply voltages. The method is to implant an electrically neutral in silicon impurity atom such as krypton, xenon or germanium into the device to form ion scattering centers. The size of the impurity atom must be much larger than the size of the silicon atom. The size difference generating a scattering center.

6 Claims, 3 Drawing Sheets

5,527,724

METHOD TO PREVENT LATCH-UP AND IMPROVE BREAKDOWN VOLATGE IN SOI MOSFETS

This Application is a Continuation of application Ser. No. 08/056,042, filed Apr. 30, 1993, now abandoned.

BACKGROUND OF THE INVENTION

This invention relates to semiconductor device processing, and more particularly, to latch-up prevention and increased breakdown voltage in SOI devices.

Circuits and devices built in SOI substrates have been shown to have many advantages over identical circuits built in bulk silicon substrates. SOI (silicon-on-insulator) technology has been touted as a promising approach for fabricating advanced integrated circuits because of its faster speed and improved radiation tolerance. However, one of the disadvantages of SOI devices is the parasitic bipolar induced latch-up/breakdown voltage, which severely limits the maximum power supply voltage at which SOI circuits and devices can operate. When the parasitic device turns on, the SOI device cannot be switched off by changing its gate bias. This single transistor latch-up also manifests itself as a very low breakdown voltage. The SOI device self latch-up effect is caused by a positive feedback mechanism generated by the steady-state balancing between the minority and majority carriers in the body of the transistor. For a given gate voltage, as the drain voltage is increased, the electric field at the body/drain junction becomes high enough so that electron/hole pairs are generated by impact ionization. The majority carriers (carriers of the same dopant type as the source and drain) are collected at the drain while minority carriers travel into the body of the transistor. In SOI devices, the body of the transistor is separated from the substrate by a buried oxide. The minority carriers thus collect in the body of the transistor. At sufficiently high drain bias, the concentration of minority carriers in the body disturbs the normal steady state potential of the body. To compensate, majority carriers are injected from the source. These carriers then diffuse to the high field region of the drain/body junction, creating even more electron/hole pairs by impact ionization, and cause a run-away current in the device.

Several approaches have been discussed in the known art for increasing the voltage at the drain for onset of the device self latch-up/breakdown effect. The known approaches are based on reducing the drain electric field for a given drain bias (LDD approaches) or adding an extra contact to the body of the transistor to keep it at a constant potential and to act as a sink for the excess carriers (body tie approaches).

In the body tie approach, either an extra contact is attached to the body of the transistor to keep the voltage potential from floating, or highly doped straps are used to short the body to the source. However, body ties are useful only for thick-film SOI devices. As the film becomes thinner, the sheet resistance of the body increases, and the body tie collects a lower percentage of the excess current. As a result, extra ties/straps are needed, greatly increasing the required device area. In addition, implementing body ties requires significant design changes from bulk silicon transistor technology. Thus, circuits implementing body ties must be designed for SOI from the start, thereby increasing cost.

The LDD approach aims to decrease the electric field at the body/drain junction by reducing the dopant gradient (from the very highly doped drain to the low doped body) in this region. This is accomplished by the use of a spacer to explicitly separate the drain from the body. An additional implant is used to decrease the resistance of the spacer region. This approach can be used to easily increase the operating voltage. However, a price is paid in terms of slower circuit speed. It is difficult to optimize the circuit speed versus the maximum operating voltage. In addition, the LDD process requires many process steps to be added to the transistor fabrication process.

Another approach is to reduce the lifetime of minority carriers in the transistor body. When carriers quickly recombine, a larger influx of carriers is needed to disturb the body potential sufficiently to induce the positive feedback mechanism. Thus, the voltage at which the positive feedback mechanism occurs is increased. However, it is difficult to decrease the recombination lifetime without increasing the generation lifetime. The generation lifetime refers to the generation of carriers by thermal effects. Thermally generated carriers contribute to the off-state device leakage. As devices are made with shorter gates, shorter recombination lifetimes are required to increase the maximum drain voltage. However, the generation lifetime decreases proportionally, so that the submicron devices would be excessively leaky. In addition, the minimum acceptable leakage decreases as devices are shrunk.

What is needed is a method whereby the operating voltage at which the latch-up occurs is significantly increased thus allowing circuit operation at reasonable power supply voltages.

SUMMARY OF THE INVENTION

The present invention is a method to improve the device operating voltage via implantation of electrically neutral impurity atoms into the silicon transistor devices. The implants are used to generate scattering centers in the high field region of the drain/body junction. These scattering centers reduce the mean free path of electrons, thus reducing the energy they acquire. Since the carriers have less energy, less impact ionization occurs. The neutral impurity atoms for silicon include group VIII atoms such as Krypton and Xenon. Germanium may also be used, since it is electrically neutral in silicon. It is key that the size of the impurity atom be much larger then the size of the silicon atom. The size difference generates the scattering.

BRIEF DESCRIPTION OF THE DRAWINGS

The objects, features and advantages of the invention will be fully understood with reference to the description of the preferred embodiment and the drawings wherein.

DESCRIPTION OF THE PREFERRED EMBODIMENT

The present invention employs neutral impurities to generate scattering centers in the high field region of a transistor. Neutral atom impurities include group VIII atoms such as krypton and xenon and also germanium. Because of the increased size of these atoms and with the disturbance in the band structure, high energy carriers within the transistor see more scattering centers. The amount of energy that an electron or hole accumulates in a high field region depends upon how far it travels before it encounters a scattering center. Thus, for a given drain field having neutral impurity centers the impact ionization current is reduced, this reducing the parasitic bipolar effects.

Figure 1:
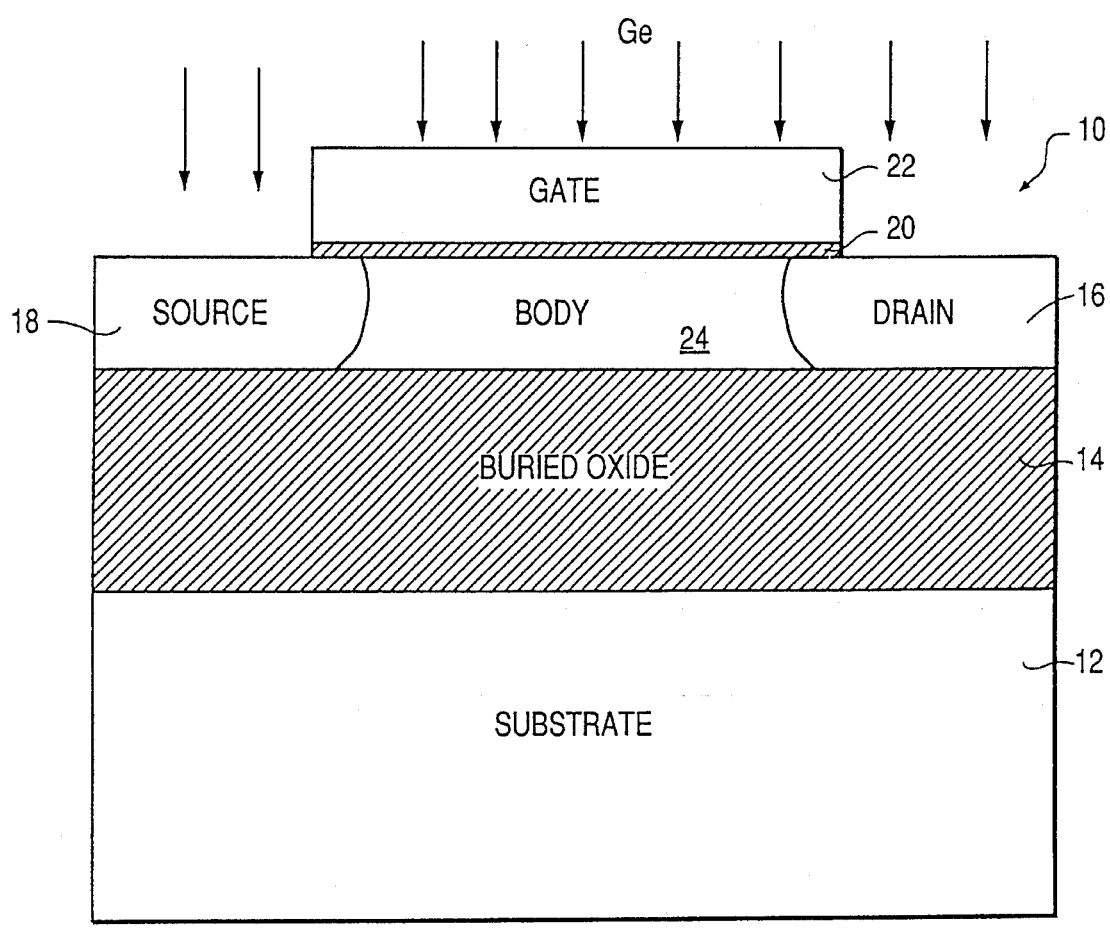
FIG. 1 is a cross sectional view of a semiconductor device built in SOI technology.

A typical SOI device is shown in FIG. 1 wherein the device 10 has a substrate 12, an insulating buried oxide 14, a drain and source region 16 and 18 respectively, a gate oxide 20, and a gate electrode 22. The body region 24 is the channel region under the gate between the source and drain regions of the device. The process prescribes the implantation of ions of a neutral species in silicon followed by an anneal to eliminate implant induced damage. The implant can be done at several different points in the process. For example, the implant can be done after the formation of the lateral isolation (through a dummy gate oxide), or after the definition of the gate.

This invention was demonstrated by the implantation of germanium. The optimum energy for the implantation depends in part whether the transistor is a surface channel or buried channel device. However, an implant energy window exists, below which one excessively damages the surface and above which one amorphizes the film. In the present process an energy of 60 KeV was used. The implant dose should be in the order of 1E14 to 1E16 cm−2 range.

It is important to follow the implantation by an anneal of the wafer to remove implant induced damage. The anneal should be at a temperature of approximately 900° C. for at least 30 minutes to remove the implant damage and to avoid leaky transistor characteristics.

The present invention avoids the problems of the approaches described in the background art. For example, unlike the body tie approach, the neutral impurity implant approach is compatible with bulk designs. Again, unlike the LDD approach, the neutral impurity implant process is very simple and does not degrade device performance. Finally, unlike the lifetime killing approach, the present method does not increase the device leakage currents.

Figure 2:
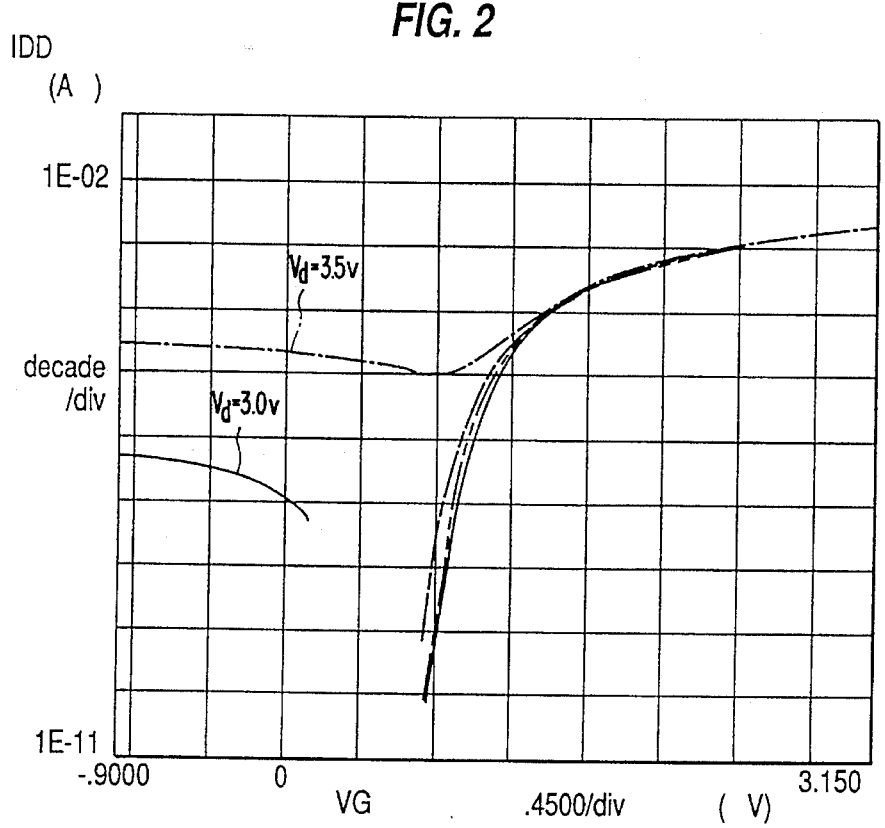
FIG. 2 is a graph of the latch-up voltage for a device without the implant.
Figure 3:
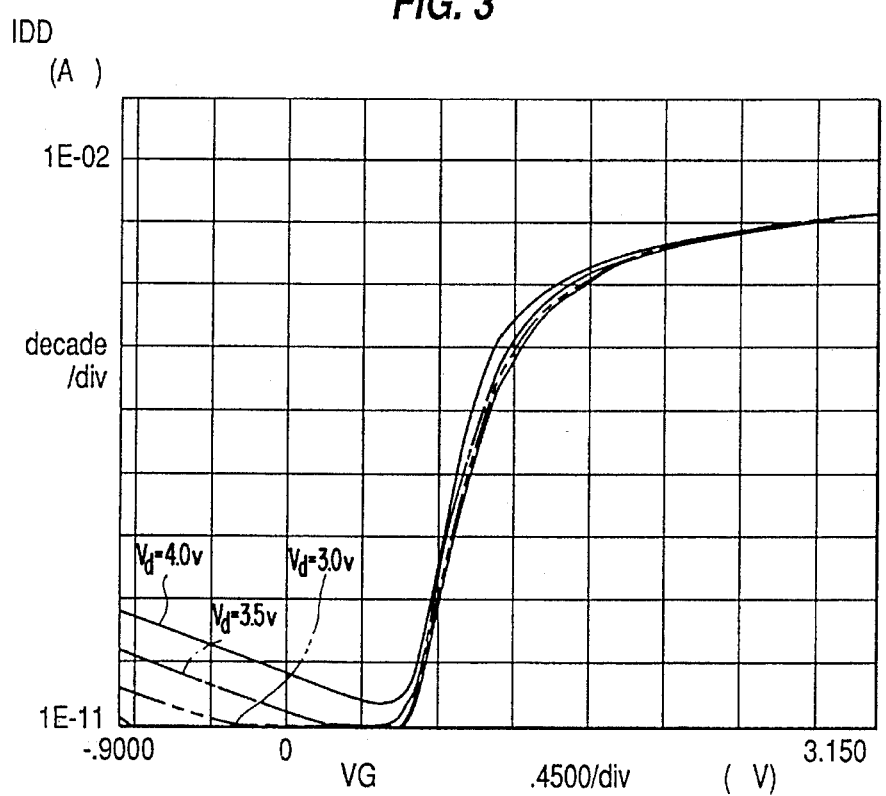
FIG. 3 is a latch-up voltage graph of a germanium implanted device according to the present invention.
Figure 4:
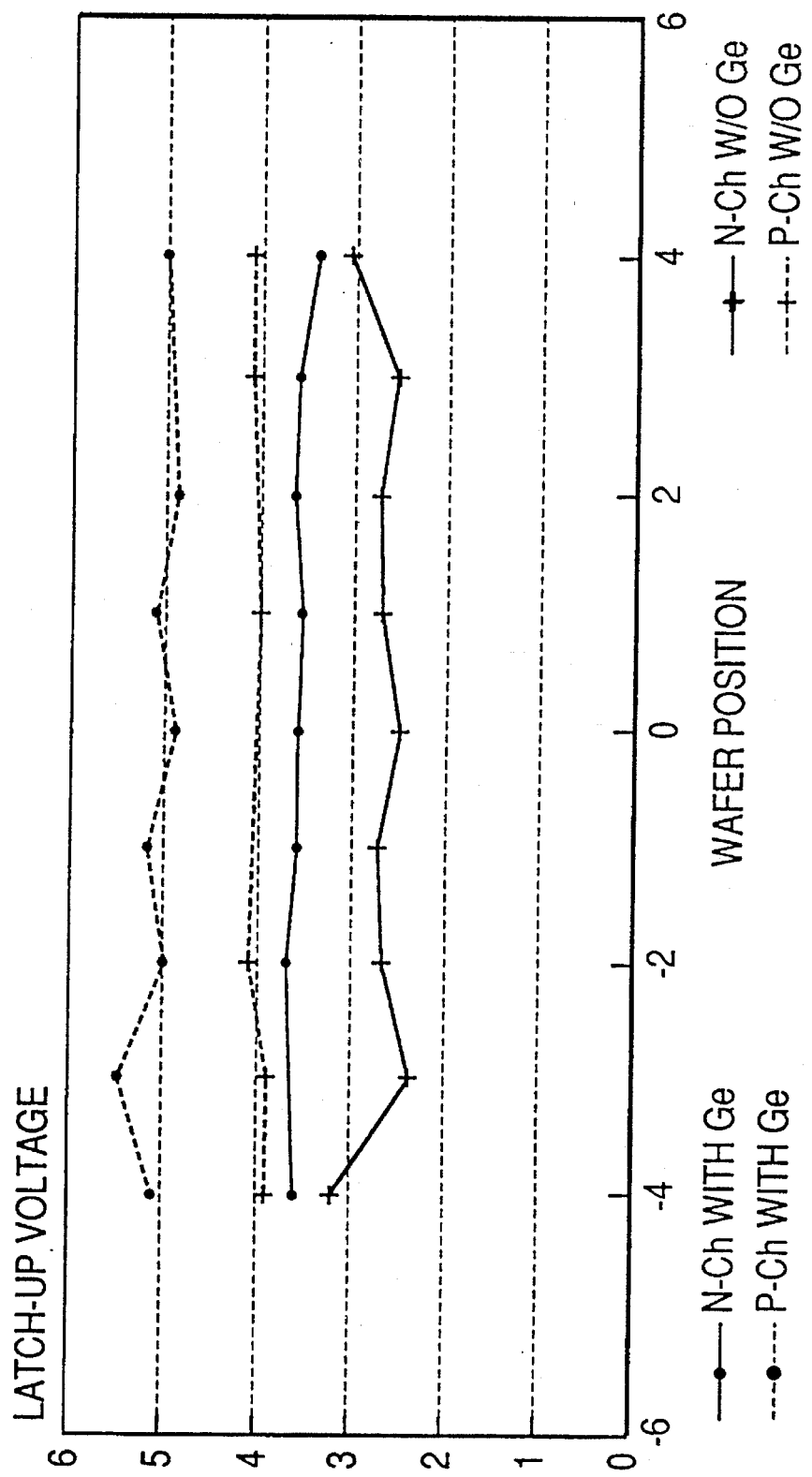
FIG. 4 is a comparison of latch-up voltages for transistors with and without a germanium implant.

The inventive process was implemented using a germanium implantation. The drain current versus gate voltage I-V characteristics for an SOI device without the neutrality impurity implant is shown in FIG. 2. It is seen that at a drain bias of around 3 volts the gate begins to lose control of the device current (self latch-up begins). For a device of the same dimensions processed identically except for the neutral impurity implant, self latch-up occurs at about 4 volts as seen in FIG. 3. Additional results are shown in FIG. 4 in which the latch-up voltage was measured for both n and p-channel devices on two device wafers, with and without the neutral impurity implant. To further demonstrate the validity of the technique, the germanium implant was applied to a single lot of wafers with one half of the wafers being implanted and the other half being without neutral impurity implantation. Measurements were taken on 147 devices. The use of the implant was seen to improve latch-up on an average of 1.04 volts.

While the invention has been shown with reference to a preferred embodiment, it would be obvious to ones skilled in the art that the process could be modified and expanded for various species of implantation, energy and dose levels without departing from the spirit of the scope of the invention.

We claim:

1. A method of fabricating silicon-on-insulator (SOI) MOSFET integrated circuits having reduced parasitic latch-up and increased breakdown voltage comprising the steps of:

a) providing a silicon-on-insulator substrate;

b) growing an oxide layer on said substrate;

c) blanket implanting the substrate with electrically neutral in silicon ions;

d) annealing the implanted substrate to remove implant induced damage to the SOI layer;

e) forming active devices on said substrate, the active devices formed comprising transistors having their source and drain regions implanted with electrically neutral in silicon ions; and f) forming electrical conductors on said substrate to interconnect said devices.

2. The method of claim 1 wherein said electrically neutral in silicon ions are selected from the group consisting of krypton, argon, and germanium.

3. The method of claim 1 wherein said ions are germanium implanted at 50 to 60 KeV with a dose in the range of 1E14 to 1E16 cm−2.

4. The method of claim 1 wherein the anneal is performed at 900° C. for at least 30 minutes.

5. A method of fabricating silicon-on-insulator (SOI) MOSFET integrated circuits having reduced parasitic latch-up and increased breakdown voltage comprising the steps of:

a) providing a silicon-on-insulator substrate;

b) forming active semiconductor devices on said substrate the active devices formed comprising transistors having source and drain regions;

c) blanket implanting the substrate after formation of the active semiconductor devices with electrically neutral in silicon ions, the implant being received in the source and drain regions of the devices;

d) annealing the implanted substrate to remove implant induced damage to the SOI layer; and e) forming electrical conductors on said substrate to interconnect said devices to form integrated circuits.

6. The method of claim 5 wherein the anneal is performed at 900° C.

* * * * *